United States Patent
Vaupel

(10) Patent No.: US 8,592,999 B2
(45) Date of Patent: Nov. 26, 2013

(54) SEMICONDUCTOR CHIP AND METHOD FOR FABRICATING THE SAME

(75) Inventor: Mathias Vaupel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 215 days.

(21) Appl. No.: 13/006,104

(22) Filed: Jan. 13, 2011

(65) Prior Publication Data
US 2012/0181710 A1   Jul. 19, 2012

(51) Int. Cl.
*H01L 23/29* (2006.01)

(52) U.S. Cl.
USPC .... 257/793; 257/787; 257/777; 257/E23.119; 257/E21.502

(58) Field of Classification Search
USPC .................. 257/793, 787, E23.119, E21.502
See application file for complete search history.

(56) References Cited

U.S. PATENT DOCUMENTS 6,461,890 B1 * 10/2002 Shibata ........................ 438/106
6,524,654 B1    2/2003 Konrad et al.

FOREIGN PATENT DOCUMENTS

EP            0 954 025 A1   11/1999

* cited by examiner

*Primary Examiner* — Long Pham
(74) *Attorney, Agent, or Firm* — Slater & Matsil, L.L.P.

(57) ABSTRACT

A semiconductor chip includes a first main face and a second main face opposed to the first main face. Side faces connect the first and second main faces. The side faces are at least partially covered with an anti-EBO compound and/or a surface energy reducing compound.

27 Claims, 6 Drawing Sheets

SEMICONDUCTOR CHIP AND METHOD FOR FABRICATING THE SAME

TECHNICAL FIELD

The present invention relates to a semiconductor chip and to a method for fabricating the same.

BACKGROUND

For fabricating electronic devices, semiconductor chips can be mounted on leadframes and their contact pads can be electrically connected with respective parts of the leadframe. The semiconductor chip is normally attached to a relatively large die pad by use of an adhesive material like, for example, an epoxy resin which, for example, can be based on a cyanate-ester formulation. One of the major problems with these die attach materials is the so-called "bleed", "bleed-out", "resin bleed", or "flash-off". These terms describe the excessive spreading of a resin on an attached substrate during curing, caused by a separation of the resin vehicle from the polymer adhesive, and in the case of a cyanate-ester formulation, a flashing-off of the monomer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1:
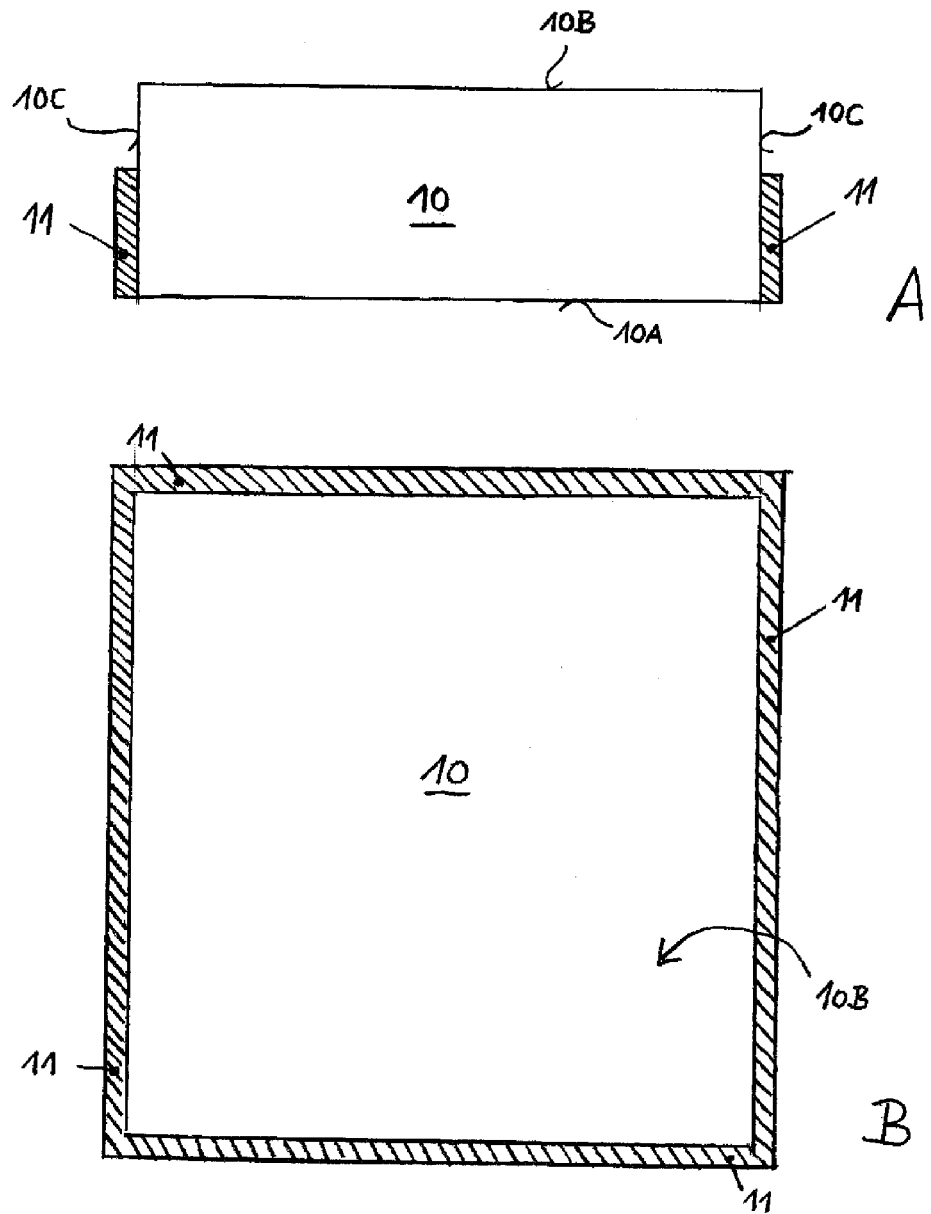
FIGS. 1A, B show a schematic cross-sectional side view representation (FIG. 1A) and a top view representation (FIG. 1B) of a semiconductor chip according to an embodiment.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless of whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method for fabricating a semiconductor chip and a semiconductor chip may use various types of semiconductor chips or circuits incorporated in the semiconductor chips, among them logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip.

In several embodiments, layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

The semiconductor chips may comprise contact elements or contact pads on one or more of their outer surfaces wherein the contact elements serve for electrically contacting the semiconductor chips. The contact elements may have any desired form or shape. They can, for example, have the form of lands, i.e., flat contact layers on an outer surface of the semiconductor package. The contact elements or contact pads may be made from any electrically conducting material, e.g., from a metal as aluminum, gold, or copper, for example, or a metal alloy, or an electrically conducting organic material, or an electrically conducting semiconductor material.

In the present application different embodiments of a method for fabricating a semi-conductor chip or an electronic device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

FIGS. 1A and 1B (collectively, FIG. 1) show a schematic cross-sectional side view representation (FIG. 1A) and a top view representation (FIG. 1B) of a semiconductor chip according to an embodiment. A semiconductor chip 10, in particular silicon based semiconductor chip 10, comprises a first main face 10A and a second main face 10B opposed to the first main face 10A and side faces 10C connecting the first and second main faces 10A and 10B. The side faces 10C are partially covered with an anti-EBO (anti epoxy bleed-out) compound 11.

The semiconductor chip 10 is supposed to be attached to a carrier with its first main face 10A by use of an adhesive compound like, for example, an epoxy resin. The anti-EBO compound 11 on the side faces 10C prevents the adhesive from creeping on the side faces 10C of the semiconductor chip 10. Therefore, the anti-EBO compound 11 is applied such that the side faces 10C are covered at least to the edges adjacent to the first main face 10A. In the direction towards the second main face 10B the side faces 10C can be covered with the anti-EBO compound 11 up to a certain height level as shown in FIG. 1A. In the representation of FIG. 1B the anti-EBO compound 11 is coated with equal thickness on all side faces 10C and it can be coated with this same thickness on the second main face 10B. However, it is also possible that the anti-EBO compound 11 is coated with a non-uniform thickness on the side faces 10C and, if the second main face 10B is also covered, on the side faces 10C and the second main face 10B.

According to an embodiment of the semiconductor chip of FIG. 1, the side faces 10C are completely covered with the anti-EBO compound 11.

According to an embodiment of the semiconductor chip of FIG. 1, the second main face 10B of the semiconductor chip 10 is also at least partially covered with the anti-EBO compound 11. In particular embodiments, the second main face 10B is completely covered with the anti-EBO compound 11.

The term anti-EBO or alternatively anti-RBO (anti resin bleed-out) is well-known in the art. For example, it is known in the art to provide leadframes with an anti-EBO coating to prevent the bleed-out of the epoxy resin on the chip pad of the leadframe during the chip attach process. According to the embodiment of FIG. 1, the chip side faces 10C are coated with the anti-EBO, so that any epoxy bleed-out and creepage on the chip side faces 10C can be efficiently avoided or at least minimized. Examples for commercially available anti-EBO compounds are known under the trade names T13 (produced and sold by Atotech) and BA-9 (produced and sold by Nippon Mining & Metals Co. Ltd.). The term anti-EBO compound also includes other substances which essentially posses the same functions and properties as the aforementioned substances.

According to an embodiment of the semiconductor chip of FIG. 1, the anti-EBO compound 11 is capable of reducing the surface energy of the chip side faces 10C.

According to an embodiment of the semiconductor chip of FIG. 1, the anti-EBO compound 11 comprises hydrophobic properties.

According to an embodiment of the semiconductor chip of FIG. 1, the side faces 10C are covered with a layer of the anti-EBO compound. In particular, the layer comprises a thickness in the range of 0.5 nm-200 nm, more particular 0.5 nm-100 nm, more particular 0.5 nm-50 nm, more particular 0.5 nm-20 nm, more particular 0.5 nm-10 nm, more particular 0.5 nm-5 nm. A thickness in the order of 0.5 nm practically means a one atom layer thickness.

According to an embodiment of the semiconductor chip of FIG. 1, the anti-EBO compound 11 is solved within a solvent and the concentration of the anti-EBO compound within the solvent is within a range of 0.5%-5%, more particular 2%-5%.

Figure 2:
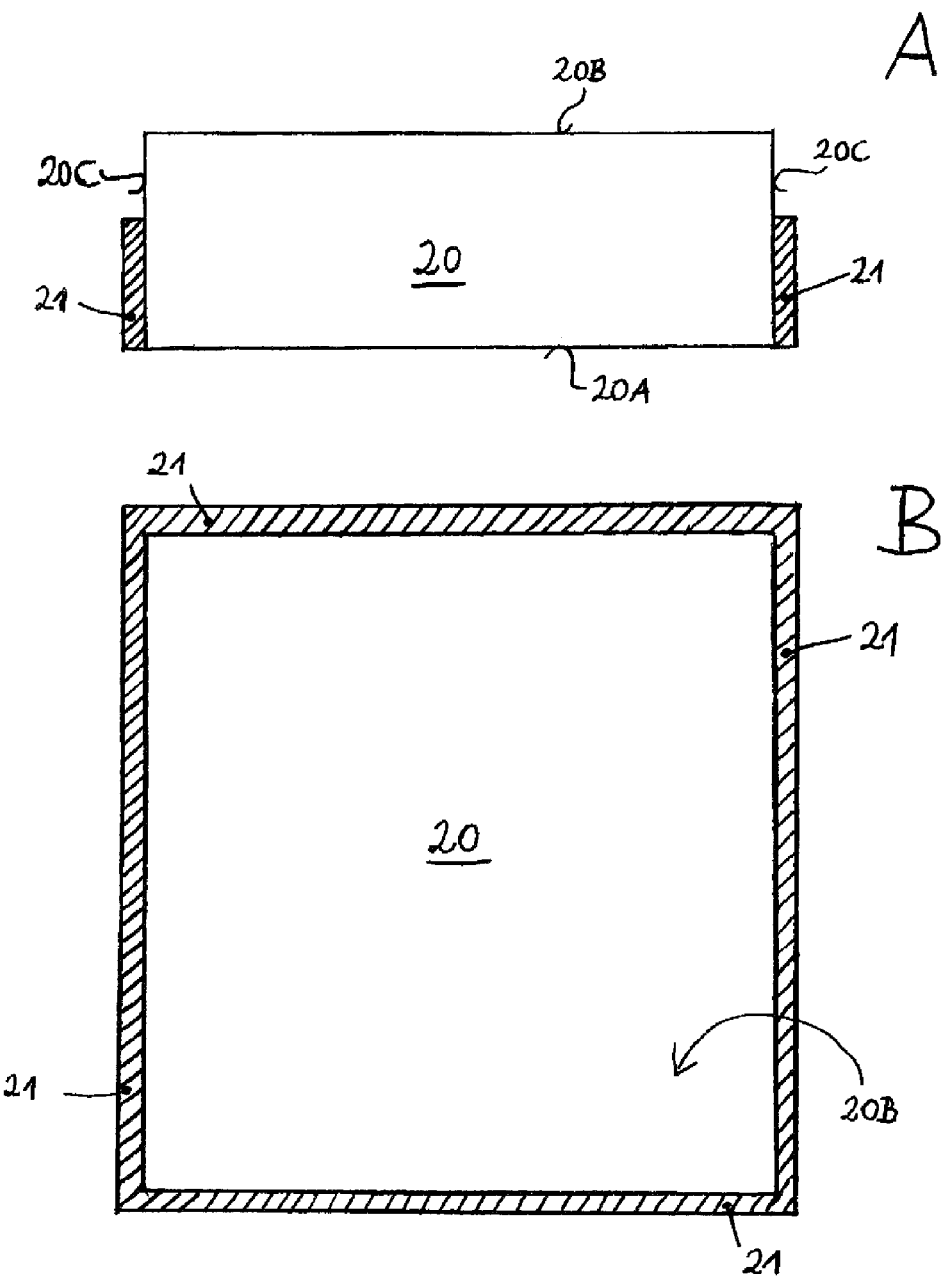
FIGS. 2A, B show a schematic cross-sectional side view representation (FIG. 2A) and a top view representation (FIG. 2B) of a semiconductor chip according to an embodiment.

FIGS. 2A and 2B (collectively FIG. 2) show a cross-sectional side view representation (FIG. 2A) and a top view representation (FIG. 2B) of a semiconductor chip according to an embodiment. The semiconductor chip 20 of FIG. 2 comprises a first main face 20A and a second main face 20B opposed to the first main face 20A and side faces 20C connecting the first and second main faces 20A and 20B. The side faces 20C are at least partially covered with a surface energy reducing compound 21. The compound 21 is thus selected such that, when deposited, it comprises a surface energy which is less than the surface energy of the uncovered side faces 20C. As shown in FIG. 2A, the compound 21 is coated down to the edges adjacent to the first main face 20A so that bleed-out of adhesive is efficiently minimized if the chip 20 is attached to a carrier with its first main face 20A.

According to an embodiment of the semiconductor chip of FIG. 2, the surface energy compound 21 comprises hydrophobic properties.

One example for the compound 21 is one of the above-mentioned well-known anti-EBO compounds. However, it is also possible to use an anorganic material as compound 21. For example, it is known that diamond like carbon (DLC) layers can be deposited and prepared to possess a specific desired surface energy, for example, by doping with fluorine or silicon. The DLC layers can be deposited, for example, by chemical vapor deposition (CVD).

According to an embodiment of the semiconductor chip of FIG. 2, the side faces 20c are completely covered with the surface energy reducing compound 21.

According to an embodiment of the semiconductor chip of FIG. 2, the second main face 20B is partially or completely covered with the compound.

According to an embodiment of the semiconductor chip of FIG. 2, the side faces 20c are covered with a layer of the surface energy reducing compound 21. In particular, the layer comprises a thickness in the range of 0.5 nm-200 nm, more particular 0.5 nm-100 nm, more particular 0.5 nm-50 nm, more particular 0.5 nm-20 nm, more particular 0.5 nm-10 nm, more particular 0.5 nm-5 nm. A thickness in the order of 0.5 nm practically means an one atom layer thickness.

According to an embodiment of the semiconductor chip of FIG. 2, the surface energy reducing compound 21 is solved within a solvent and the concentration of the compound within the solvent is within a range of 0.5%-5%, more particular 2%-5%.

Figure 3:
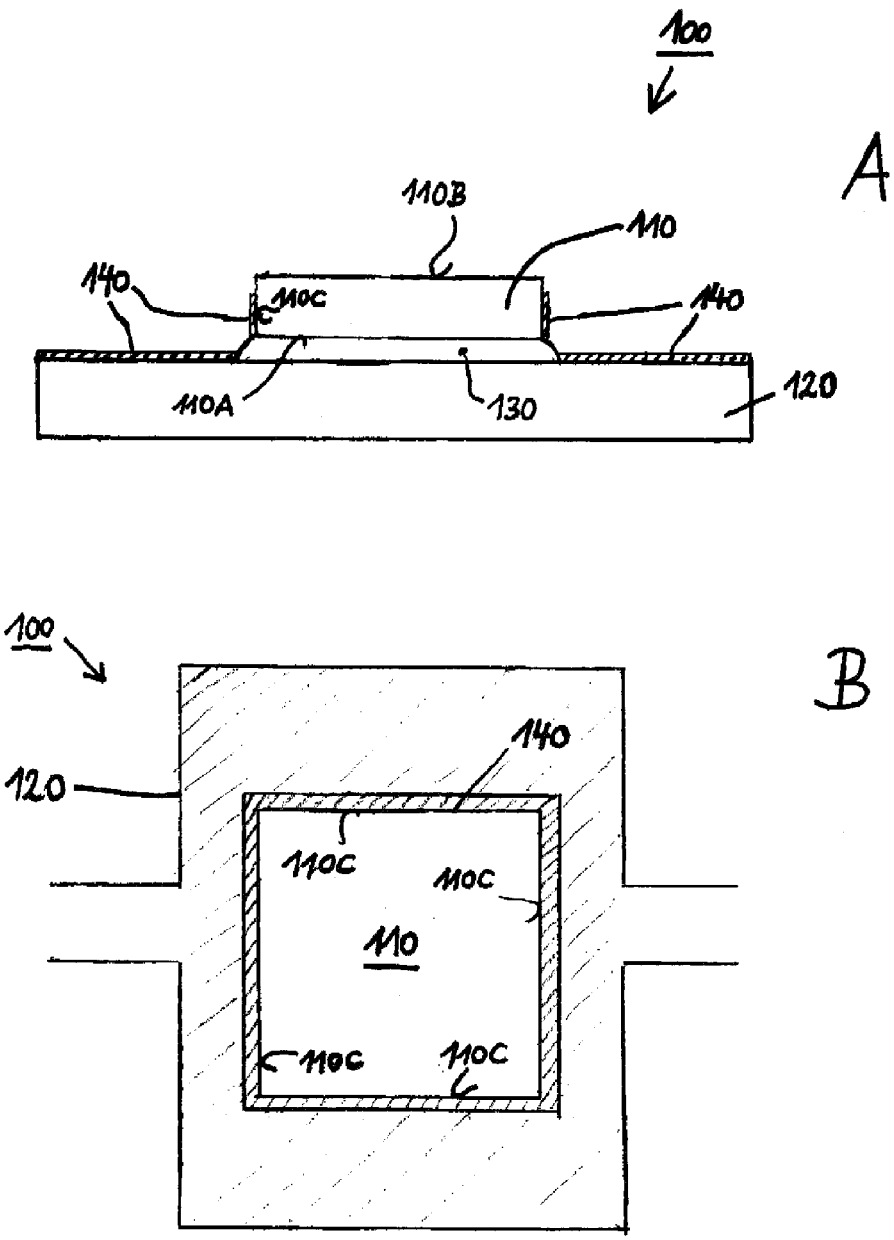
FIGS. 3A, B show a schematic cross-sectional side view representation (FIG. 3A) and a top view representation (FIG. 3B) of an electronic device according to an embodiment.

FIGS. 3A and 3B (collectively FIG. 3) show a cross-sectional side view representation (FIG. 3A) and a top view representation (FIG. 3B) of an electronic device according to an embodiment. The electronic device 100 of FIG. 3 comprises a carrier 120 and a semiconductor chip 110. The semiconductor chip 110 comprises a first main face 110A, a second main face 110B, and side faces 110C connecting the first and second main faces 110A and 110B. The semiconductor chip 110 is attached with its first main face 110A to the carrier 120 by means of an adhesive layer 130. At least partly the side faces 110C of the semiconductor chip 110 and at least partly the carrier 120 are covered with a compound 140 which is comprised of an anti-EBO compound or a surface energy reducing compound. The adhesive layer 130 can, for example, be comprised of an epoxy resin. The carrier can, for example, be comprised of a leadframe.

In FIG. 3 one and the same reference sign 140 has been used to refer to the anti-EBO compound or the surface energy reducing compound covered on the semiconductor chip 110 and the carrier 120. However, this does not necessarily mean that one and the same of these compounds is used for the semiconductor chip 110 and the carrier 120. In addition, different compounds can be used to cover the semiconductor chip faces and the carrier surface. It is also possible not to cover the carrier surface with any anti-EBO compound if it is found not to be necessary. If found appropriate, the carrier may comprise an anti tarnish coating instead.

According to an embodiment of the electronic device of FIG. 3, the side faces 110C of the semiconductor chip 110 are completely covered with the compound 140.

According to an embodiment of the electronic device of FIG. 3, also the second main face 110B of the semiconductor chip 110 is partially or completely covered with the compound 140.

According to an embodiment of the electronic device of FIG. 3, the anti-EBO compound 140 provided on the side faces 110C of the semiconductor chip 110 is capable of reducing the surface energy of the chip faces.

According to an embodiment of the electronic device of FIG. 3, the anti-EBO compound 140 provided on the leadframe surface is capable of reducing the surface energy of the leadframe surface.

According to an embodiment of the electronic device of FIG. 3, the side faces are covered with a layer of the anti-EBO compound. In particular, the layer comprises a thickness in the range of 0.5 nm-200 nm, more particular 0.5 nm-100 nm, more particular 0.5 nm-50 nm, more particular 0.5 nm-20 nm, more particular 0.5 nm-10 nm, more particular 0.5 nm-5 nm.

According to an embodiment of the electronic device of FIG. 3, the compound 140 is solved within a solvent and the concentration of the anti-EBO compound within the solvent is within a range of 0.5%-5%, more particular 2%-5%. In particular, different concentrations can be used for the compound to be used for the chip 110 and the carrier 120 even if the compound as such is the same. It may be the case that some residual bleed-out will occur. By choosing different concentrations this residual bleed-out can be properly balanced so that no imbalance of creepage on chip and carrier will take place.

Figure 4:
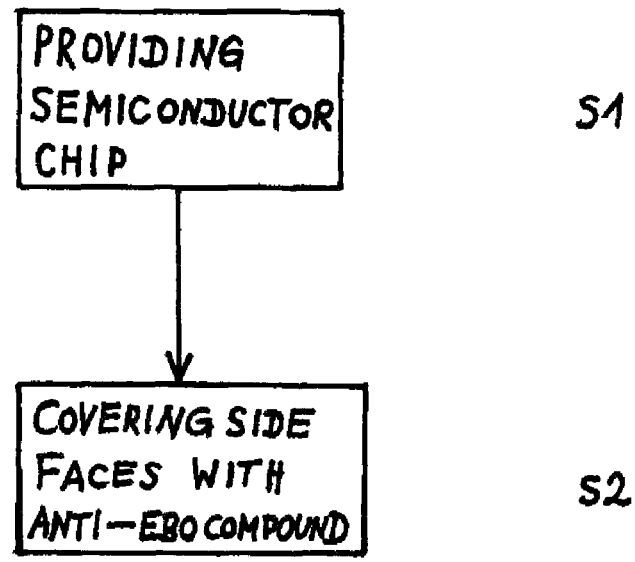
FIG. 4 shows a flow diagram of a method for fabricating a semiconductor chip according to an embodiment.

Referring to FIG. 4, a flow diagram illustrates a method for fabricating a semiconductor chip according to an embodiment. The method comprises providing a semiconductor chip, the semiconductor chip comprising a first main face, a second main face opposed to the first main face, and side faces connecting the first and second main faces (s1), and covering at least partially the side faces with an anti-EBO compound or a surface energy reducing compound (s2).

According to an embodiment of the method of FIG. 4, the side faces of the semiconductor chip are completely covered with the anti-EBO compound or the surface energy reducing compound.

According to an embodiment of the method of FIG. 4, also the second main face of the semiconductor chip is partially or completely covered with the anti-EBO compound or the surface energy reducing compound. Examples for these compounds have been given in the previous embodiments.

Figure 5:
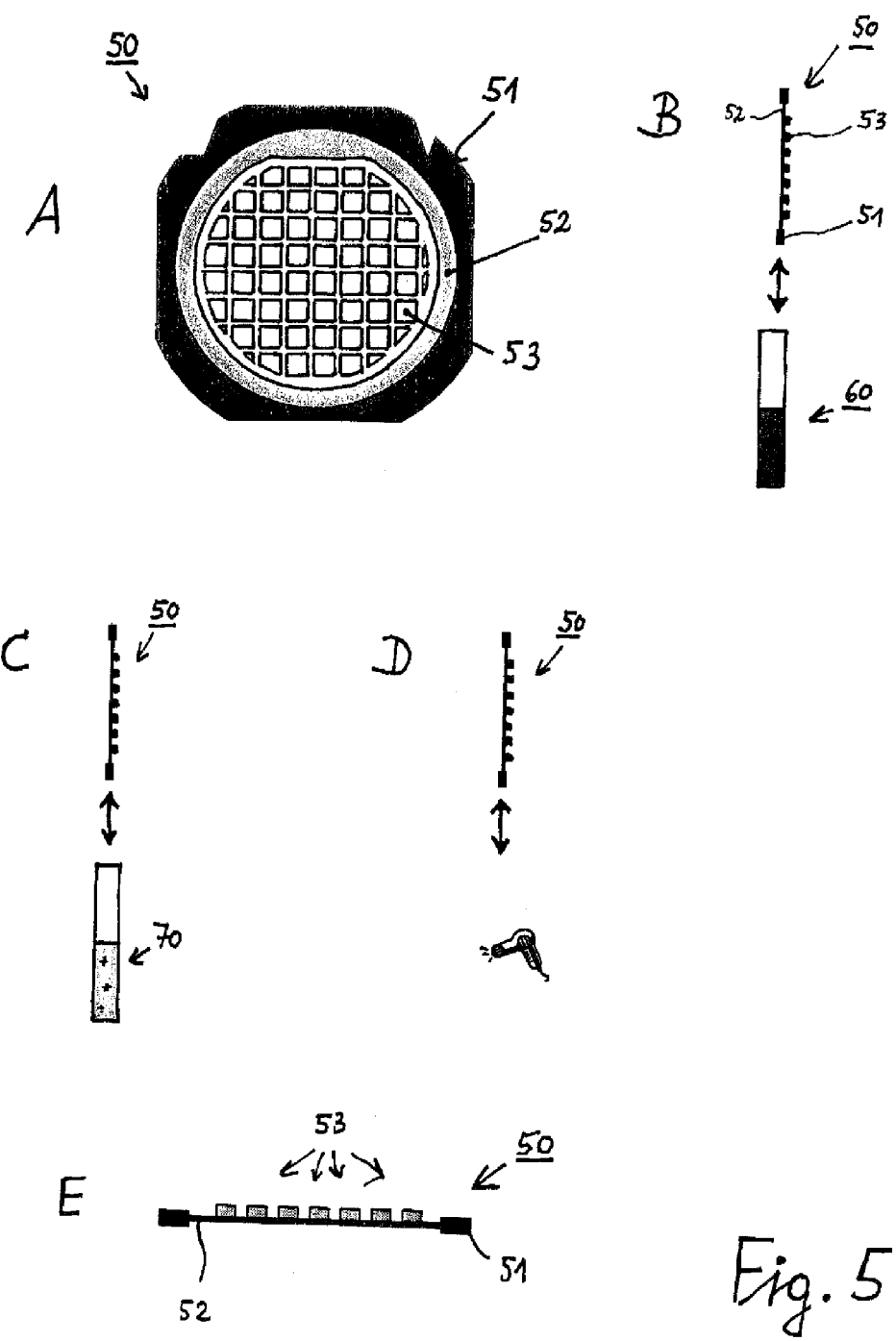
FIGS. 5A-E show schematic top view (Fig. A) and cross-sectional side view representations (FIGS. 5B-5E) to illustrate a method for fabricating a semiconductor chip according to an embodiment.

Referring to FIGS. 5A-5E, a schematic top view (FIG. 5A) and cross-sectional side view representations (FIGS. 5B-5E) illustrate a method for fabricating a semiconductor chip according to an embodiment. After fabricating a plurality of semiconductor chips or dies on a semiconductor wafer, the chips are singulated and attached to an expandable tape. The tape is secured within a wafer frame. FIG. 5A shows a top view of an assembly 50 composed of a wafer frame 51 holding a tape 52 and a plurality of semiconductor chips 53 attached to the tape 52.

FIG. 5B shows in the upper half a cross-sectional side view representation of the assembly 50 and in the lower half a schematic representation of a bath 60 containing in liquid form an anti-EBO compound or a surface energy reducing compound. The arrows indicate that the assembly 50 is dipped into the bath 60 so that the compound will adhere at the exposed surfaces of the semiconductor chips 53. In addition it is also possible to feed ultrasound waves into the liquid anti-EBO in order to improve the penetration of the anti-EBO into the intermediate spaces between the chips 53.

FIG. 5C shows a cross-sectional representation of the assembly 50 in the upper half and a schematic representation of a water bath 70 in the lower half, wherein the arrows indicate that a cleaning step is performed by dipping the assembly 50 into the water bath 70.

FIG. 5D schematically shows a drying step wherein the assembly 50 is exposed to heat in order to be dried.

Finally, FIG. 5E shows the assembly 50 wherein the chips 53 are covered on their side faces and their second main faces with a layer of the anti-EBO compound or the surface energy reducing compound. The first main face of the chips is attached to the tape and does not need to be covered with the anti-EBO compound or the surface energy reducing compound as the chips are to be attached on the leadframe with their respective first main surfaces.

Figure 6:
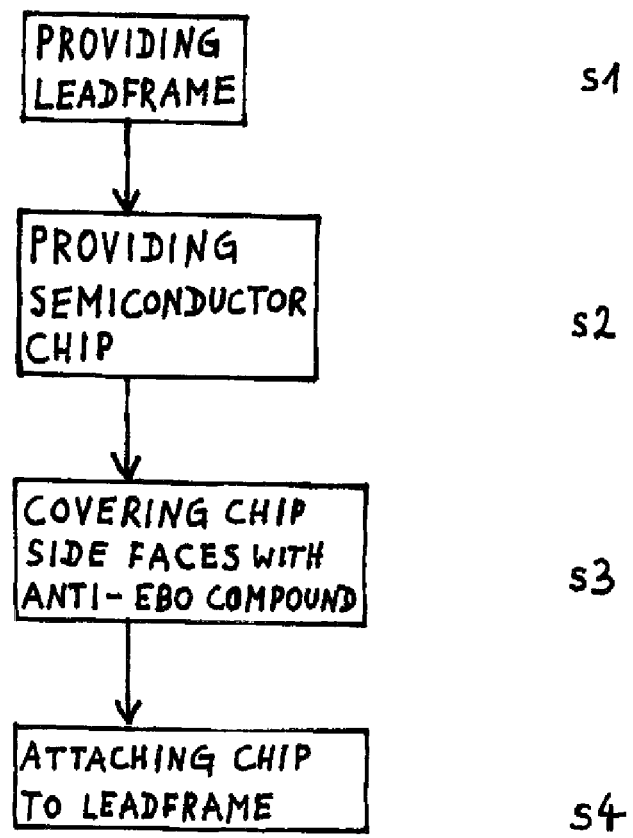
FIG. 6 shows a flow diagram of a method for fabricating an electronic device according to an embodiment.

FIG. 6 shows a flow diagram of a method for fabricating an electronic device according to an embodiment. The method comprises providing a carrier, such as a leadframe (s1). A semiconductor chip comprising a first main face and a second main face opposed to the first main face and side faces connecting first and second main faces is also provided (s2). The side faces are at least partly covered with an anti-EBO compound or a surface energy reducing compound (s3) and the semiconductor chip is attached with its first main face to the carrier (s4).

According to an embodiment of the method of FIG. 6, the side faces are completely covered with the anti-EBO compound or the surface energy reducing compound.

According to an embodiment of the method of FIG. 6, the second main face of the semiconductor chip is also covered with the anti-EBO compound or the surface energy reducing compound.

According to an embodiment of the method of FIG. 6, the carrier is also at least partly covered with the anti-EBO compound or the surface energy reducing compound. For example only the upper surface of the carrier may be covered with the compound. It is also possible that the carrier is completely covered with the compound. Either the same or another compound as was used for the chip can be used for the carrier.

According to an embodiment of the method of FIG. 6, the semiconductor chip is attached to the leadframe by means of an epoxy resin.

According to an embodiment of the method of FIG. 6, the anti-EBO compound coated on the side faces of the semiconductor chip is capable of reducing the surface energy of the chip faces, and in case that an anti-EBO compound is also coated on the carrier then this compound is capable of reducing the surface energy of the carrier surface.

According to an embodiment of the method of FIG. 6, the method further comprises providing a plurality of semiconductor chips, attaching the semiconductor chips to a support, and dipping the support in a liquid comprised of the anti-EBO compound or the surface energy reducing compound. The support can be comprised of an expandable tape which can be fixed within a wafer frame. According to a further embodiment thereof the method further comprises, after dipping cleaning the support in water and, if necessary, after cleaning drying the support.

What is claimed is:

1. A semiconductor chip, comprising:
   a first main face;
   a second main face opposed to the first main face;
   side faces connecting the first and second main faces; and
   an anti-epoxy bleed out (EBO) compound, at least partially covering the side faces, the compound having a uniform thickness along the side faces.

2. The semiconductor chip according to claim 1, wherein the second main face is at least partially covered with the anti-EBO compound.

3. The semiconductor chip according to claim 1, wherein the anti-EBO compound comprises a surface energy reducing compound that has a surface energy that is less than a surface energy of the side faces.

4. The semiconductor chip according to claim 1, wherein the anti-EBO compound comprises hydrophobic properties.

5. A semiconductor chip, comprising:
   a first main face;
   a second main face opposed to the first main face;
   side faces connecting the first and second main faces; and
   a surface energy reducing compound at least partially covering the side faces, the surface energy reducing compound has a surface energy that is less than a surface energy of the side faces.

6. The semiconductor chip according to claim 5, wherein the second main face is at least partially covered with the surface energy reducing compound.

7. The semiconductor chip according to claim 5, wherein the surface energy reducing compound comprises hydrophobic properties.

8. An electronic device, comprising:
   a carrier; and
   a semiconductor chip comprising a first main face, a second main face opposed to the first main face and side faces connecting the first and second main faces;
   wherein the semiconductor chip is attached with its first main face to an upper surface of the carrier; and
   wherein the side faces of the semiconductor chip are at least partially covered with a compound, the compound comprising an anti-epoxy bleed out (EBO) compound and/or a surface energy reducing compound, the compound having a uniform thickness along the side faces.

9. The electronic device according to claim 8, wherein the upper surface of the carrier is also at least partially covered with the compound.

10. The electronic device according to claim 8, wherein the second main face is at least partially covered with the compound.

11. The electronic device according to claim 8, wherein the compound comprises an anti-EBO compound that is capable of reducing the surface energy of the side faces.

12. The electronic device according to claim 8, wherein the compound comprises hydrophobic properties.

13. The semiconductor chip according to claim 1, wherein the uniform thickness is between 0.5 nm to 200 nm.

14. The semiconductor chip according to claim 1, wherein the side faces are completely covered with the anti-EBO compound.

15. The semiconductor chip according to claim 1, wherein the anti-EBO compound covers the side faces along edges of the side faces adjacent to the first main face.

16. The semiconductor chip according to claim 2, wherein the anti-EBO compound has the uniform thickness along the second main face and the side faces.

17. The semiconductor chip according to claim 5, wherein the surface energy reducing compound comprises an anorganic material.

18. The semiconductor chip according to claim 17, wherein the anorganic material comprises diamond like carbon (DLC) layers.

19. The electronic device according to claim 8, wherein the compound comprises an anti-EBO compound.

20. The electronic device according to claim 8, wherein the compound comprises a surface energy reducing compound that a surface energy that is less than the surface energy of the side faces.

21. An electronic device, comprising:
    a carrier; and
    a semiconductor chip comprising a first main face, a second main face opposed to the first main face and side faces connecting the first and second main faces; and
    an adhesive attachment layer connecting the first main face of the semiconductor chip to an upper surface of the carrier,
    wherein the side faces of the semiconductor chip are at least partially covered with a first material layer and wherein the upper surface of the carrier is at least partially covered with a second material layer, wherein the adhesive attachment layer is bounded by the first and second layers of the material.

22. The electronic device according to claim 21, wherein the first material layer comprises a surface energy reducing compound that has a surface energy that is less than a surface energy of the side faces of the semiconductor chip.

23. The electronic device according to claim 22, wherein the second material layer comprises a surface energy reducing compound that has a surface energy that is less than a surface energy of the upper surface of the carrier.

24. The electronic device according to claim 23, wherein the upper surface of the carrier is at least partially covered with a different surface energy reducing compound than the compound covering the side faces of the semiconductor chip.

25. The electronic device according to claim 22, wherein the surface energy reducing compound comprises an anorganic material.

26. The electronic device according to claim 25, wherein the anorganic material comprises diamond like carbon (DLC) layers.

27. A semiconductor chip, comprising:
    a first main face;
    a second main face opposed to the first main face;
    side faces connecting the first and second main faces; and
    a material at least partially covering the side faces and second main face of the semiconductor chip, the material comprising an anti-EBO compound and/or a surface energy reducing compound.

* * * * *